US006665528B2

(12) United States Patent  (10) Patent No.: US 6,665,528 B2
McNamara et al.  (45) Date of Patent: Dec. 16, 2003

(54) DUAL BAND FET MIXER

(75) Inventors: Brian J. McNamara, Haverhill, MA (US); Heinz Banzer, Grafing (DE); Ludger Verweyen, Munich (DE)

(73) Assignee: Infineon Technologies North America Corp., San Jose, CA (US)

( * ) Notice: Subject to any disclaimer, the term of this patent is extended or adjusted under 35 U.S.C. 154(b) by 0 days.

(21) Appl. No.: 09/876,258

(22) Filed: Jun. 6, 2001

(65) Prior Publication Data

US 2002/0077070 A1 Jun. 20, 2002

Related U.S. Application Data

(60) Provisional application No. 60/210,158, filed on Jun. 7, 2000.

(51) Int. Cl.[7] .................................................. H04B 1/26
(52) U.S. Cl. ........................................ 455/326; 455/333
(58) Field of Search ................................. 455/333, 326, 455/319, 332, 318, 325, 313; 333/100, 132, 25, 133; 327/120, 359, 356, 427, 437, 355, 361, 551

(56) References Cited

U.S. PATENT DOCUMENTS

| 4,203,073 | A | | 5/1980 | Rae et al. |
| 4,449,245 | A | * | 5/1984 | Rabe ........................... 455/319 |
| 4,636,663 | A | | 1/1987 | Jongepier et al. |
| 4,937,516 | A | | 6/1990 | Sempel |
| 5,280,648 | A | * | 1/1994 | Dobrovolny ................. 455/326 |
| 5,379,457 | A | | 1/1995 | Nguyen |
| 5,521,545 | A | | 5/1996 | Terry et al. |
| 5,548,840 | A | | 8/1996 | Heck |
| 5,630,228 | A | * | 5/1997 | Mittel .......................... 455/326 |
| 5,649,288 | A | | 7/1997 | De Loe, Jr. et al. |
| 5,675,392 | A | | 10/1997 | Nayebi et al. |
| 5,678,224 | A | * | 10/1997 | Murtojarvi .................. 455/326 |
| 5,678,225 | A | | 10/1997 | Kobayashi |
| 5,678,226 | A | * | 10/1997 | Li et al. ....................... 455/333 |
| 5,760,632 | A | | 6/1998 | Kawakami et al. |
| 5,809,410 | A | | 9/1998 | Stuebing et al. |
| 5,821,802 | A | | 10/1998 | Yuen |
| 5,844,449 | A | | 12/1998 | Abeno et al. |
| 5,859,558 | A | | 1/1999 | Chen et al. |
| 5,884,154 | A | * | 3/1999 | Sano et al. .................. 455/321 |
| 6,026,286 | A | | 2/2000 | Long |
| 6,057,714 | A | * | 5/2000 | Andrys et al. .............. 327/105 |
| 6,411,801 | B1 | * | 6/2002 | Kim et al. ................... 455/333 |

FOREIGN PATENT DOCUMENTS

| EP | 0 455 711 B1 | | 5/1997 |
| JP | 411205043 A | * | 7/1999 |
| WO | WO 00/76059 | | 12/2000 |

OTHER PUBLICATIONS

Ali et al., "A Highly Integrated Monolithic X–Ku Band Upconverter," *IEEE*, 1988, pp. 157–160.

* cited by examiner

Primary Examiner—Marsha D. Banks-Harold
Assistant Examiner—Nghi Han Ly
(74) Attorney, Agent, or Firm—Fish & Richardson P.C.

(57) ABSTRACT

A dual band mixer has a common node for at least one radio frequency input and an intermediate frequency output. The dual band mixer also has a first transistor with a gate coupled to a first local oscillator input and a drain coupled to the common node, and a second transistor with a gate coupled to a second local oscillator input and a drain coupled to the common node. Interconnection circuitry turns off the second transistor when the first local oscillator input signal is applied to the first transistor, and turns off the first transistor when the second local oscillator input signal is applied to the second transistor.

11 Claims, 1 Drawing Sheet

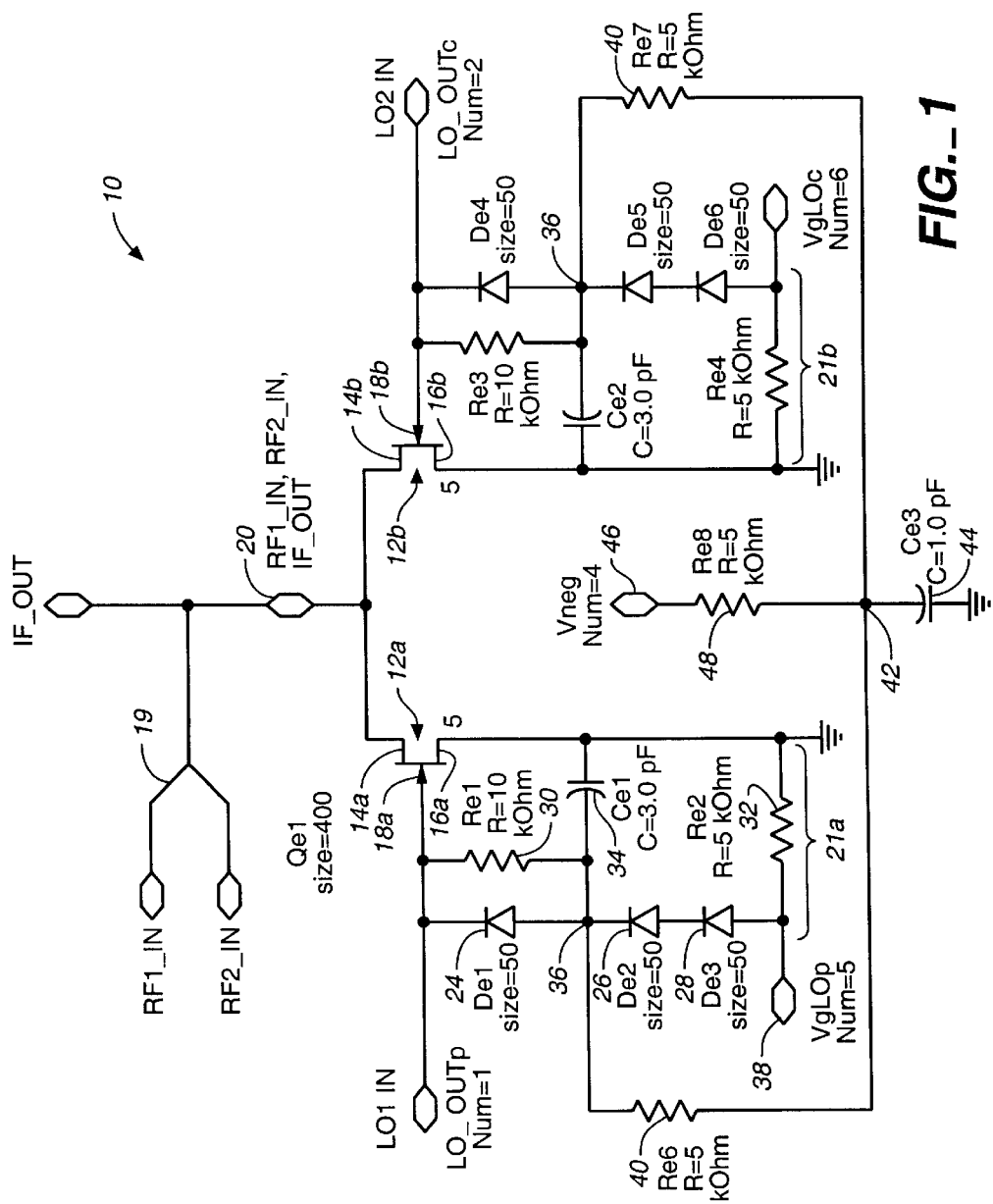
FIG._1

DUAL BAND FET MIXER

CROSS-REFERENCE TO RELATED APPLICATIONS

This application claims priority to Provisional U.S. Patent Application Serial No. 60/210,158, filed Jun. 7, 2000, the entirety of which is incorporated herein by reference.

BACKGROUND

The present application relates to mixing signals from two different frequency bands.

In some devices, such as wireless telephones, it is often desirable to have circuitry that can operate in two radio frequency (RF) bands (or dual bands) while using a common intermediate frequency and common intermediate frequency (IF) circuitry. Unfortunately, a potential problem with such mixing circuitry is signal loss. Another potential problem is that the mixing circuitry may need a large number of components, thereby increasing the cost, power consumption and heat generated by the circuitry.

One conventional dual band mixing technique is to use two separate mixers with separate IF outputs. The separate IF outputs are either combined or selected with a switching circuit. Unfortunately, such circuitry can be large for IF frequency and is particularly undesirable in MMIC applications.

In another conventional dual band mixing technique, the IF circuitry is duplicated for each RF band up to the point where the combination of the IF signals paths can be more easily implemented. However, this duplicate circuitry has the disadvantage of increasing the number of components.

Another conventional dual band mixer technique is to use a single classical mixer with switches at the RF and local oscillator (LO) ports. Using this technique, a single IF output can be achieved. Unfortunately, disadvantages of this technique are that the RF and LO switches can introduce losses and increase the amount of switch circuitry.

SUMMARY

In one aspect, the invention is directed to a dual band mixer that has a common node for at least one radio frequency input and an intermediate frequency output. The dual band mixer also has a first transistor with a gate coupled to a first local oscillator input and a drain coupled to the common node, and a second transistor with a gate coupled to a second local oscillator input and a drain coupled to the common node.

Implementations of the invention may include one or more of the following features. The sources of the first and second transistors may be coupled to ground. The first and second transistors may be field effect transistors, e.g., depletion-type transistors. Circuitry may turn off the second transistor when a first local oscillator signal is applied to the gate of the first transistor and turn off the first transistor when a second local oscillator signal is applied to the gate of the second transistor. The circuitry may include a first network associated with the first transistor to generate a first negative voltage at a first node when the first local oscillator signal is applied to the gate of the first transistor and a second network associated with the second transistor to generate a second negative voltage at a second node when the second local oscillator signal is applied to the gate of the second transistor. The first network may include a first diode connected between the gate of the first transistor and the first node, and a first capacitor and a second diode connected in parallel between the source of the first transistor and the first node. Similarly, the second network may include a third diode connected between the gate of the second transistor and the second node, and a second capacitor and a fourth diode connected in parallel between the source of the second transistor and the second node. A common line may couple the first and second nodes. The circuitry need not require an external voltage source. A switch may direct one of a plurality of radio frequency inputs to the common node.

In another aspect, the invention is directed to a method of mixing in a dual band mixer. In the method, a gate of a first transistor is driven with a first local oscillator input, a gate of a second transistor is driven with a second local oscillator input, a radio frequency input is provided to a common node that is coupled to drains of the first and second transistors, and an intermediate frequency output is sensed from the common node.

In another aspect, the invention is directed to a dual band mixer that has a first transistor to mix a first local oscillator input signal with a first radio frequency signal, a second transistor to mix a second local oscillator input signal with a second radio frequency signal, and interconnection circuitry to turn off the second transistor when the first local oscillator input signal is applied to the first transistor and to turn off the first transistor when the second local oscillator input signal is applied to the second transistor.

Implementations of the invention may include one or more of the following features. Drains of the first and second transistors may be coupled to a common node for at least one of the first and second radio frequency input signals and an intermediate frequency output. The first and second transistors may be field effect transistors, e.g., depletion-type transistors. The interconnection circuitry may include a first network associated with the first transistor to generate a first negative voltage at a first node when the first local oscillator signal is applied to the gate of the first transistor and a second network associated with the second transistor to generate a second negative voltage at a second node when the second local oscillator signal is applied to the gate of the second transistor. The first network may include a first diode connected between the gate of the first transistor and the first node, and a first capacitor and a second diode connected in parallel between the source of the first transistor and the first node. The second network may include a third diode connected between the gate of the second transistor and the second node, and a second capacitor and a fourth diode connected in parallel between the source of the second transistor and the second node. A common line may couple the first and second nodes.

In another aspect, the invention is directed to a dual band mixer that has a plurality of transistors to mix a plurality of local oscillation input signals with a plurality of radio frequency signals, and interconnection circuitry coupling the plurality of transistors configured to turn off transistors other than one transistor at which a local oscillation input signal is received.

In another aspect, the invention is directed to a method of mixing in a dual band mixer. In the method, a first local oscillator input signal is mixed with a first radio frequency signal at a first transistor and a second local oscillator input signal is mixed with a second radio frequency signal at a second transistor. The second transistor is turned off when the first local oscillator input signal is applied to the first transistor, and the first transistor is turned off when the second local oscillator input signal is applied to the second transistor.

Potential advantages of the invention may include one or more of the following. The mixing circuitry can reduce signal losses, and can be realized with a small number of components. The mixing circuitry can have a single IF output without requiring a switch for the LO input signals. In addition, the mixing circuitry can provide a negative voltage output for use in surrounding circuitry.

BRIEF DESCRIPTION OF THE DRAWINGS

The FIGURE is a circuit diagram illustrating a dual band FET mixer according to the present invention.

DETAILED DESCRIPTION

A dual band FET mixer 10 includes a first field effect transistor (FET) 12a and a second field effect transistor 12b connected in parallel. For each FET 12a and 12b, the drains 14a and 14b are connected together, whereas the sources 16a and 16b are connected to ground. The drains 14a and 14b of the FETs 12a and 12b are connected to a common terminal 20 that serves as the connection for both the radio frequency (RF) inputs RF1_IN, RF2_IN and the intermediate frequency (IF) output IF_OUT. The single IF output can serve both operating RF bands. The gate 18a of the first FET 12a is connected to the first local oscillator signal LO1, whereas the gate 18b of the second FET 12a is connected to the second local oscillator signal LO2. A switch 19 is used to direct one of the two RF inputs to the terminal 20.

Associated with FET 12a is circuitry 21a that includes a diode and resistor network, including diodes 24, 26, 28, resistors 30, 32, and capacitor 34. Capacitor 34 is connected between the source 16a of FET 12a and a node 36, and diode 24 and resistor 30 are connected in parallel between the gate 18a of FET 12a and node 36. Resistor 32 is connected between the source 16a of FET 12a and a controllable voltage terminal 38, whereas diodes 26, 28 are connected between the controllable voltage terminal 38 and the node 36.

The circuitry 21b associated with FET 12b has a similarly constructed diode and resistor network, and will not be further discussed.

The nodes 36 associated with the first and second FETs 12a and 12b are both connected by resistors 40 to a common node 42, which is coupled to ground by a common capacitor 44 and to a negative voltage terminal 46 by a resistor 48.

Good mixing performance in each operating band can be achieved by biasing the FETs 12a and 12b so that, for operation in the first band, the RF1_IN signal flows only through the first FET 12a and for operation in the second band, the RF2_IN signal flows only through the second FET 12b. In other words, the second FET 12b is turned "off" when the local oscillator signal LO1 is applied to the gate 18a of the first FET 12a, whereas the first FET 12a is turned "off" when the local oscillator signal LO2 is applied to the gate 18b of the second FET 12b. Consequently, there is virtually no signal degradation as compared to a single band mixer.

The FETs 12a and 12b can be turned off by providing the proper DC voltages to the gates 18a and 18b, respectively. In the illustrated implementation, when the first local input signal LO1 is applied to the first FET 12a, a negative voltage is generated at the gate 18b of the second FET 12b, thereby turning off the second FBT 12b. Similarly, when the second local input signal LO2 is applied to the second FET 12b, a negative voltage is generated at the gate 18a of the first FET 12a, thereby turning off the first FET 12a.

In one implementation, the FETs 12a and 12b are depletion-type FETs. The depletion-type FETs require a negative voltage between the gate and source to be turned off. Since the source terminals are grounded, a negative voltage needs to be provided at the gate. Each diode and transistor network can generate a negative voltage from the voltage swing of the associated local oscillator signal, and since the diode and transistor networks are coupled through the common node 42, the negative voltage can be applied to the gate of the other FET.

Specifically, when the first local oscillator signal LO1 is applied to the gate 18a of the first FET 12a, the voltage swings in the signal LO1 cause the first diode and resistor network 21a to generate a negative voltage at node 36, which is then transferred by the common node 42 to the gate 18b of the second FET 12b, thereby deactivating the second FET 12b. Similarly, when the second local oscillator signal LO2 is applied to the gate 18b of the second FET 12b, the voltage swings in the signal LO2 cause the second diode and resistor network 21b to generate a negative voltage at node 36, which is then transferred by the common node 42 to the gate 18a of the first FET 12a, thereby deactivating the first FET 12a. Circuitry to generate a negative voltage is also discussed in U.S. Pat. No. 5,465,419, the entirety of which is incorporated by reference.

The claims are not limited to the implementation described. For example, different bias networks could be used to turn off the FETs using a control signal or other means.

What is claimed is:

1. A dual band mixer, comprising:
    a common node for a first radio frequency input, a second frequency input and an intermediate frequency output, the first radio frequency input to receive a first radio frequency input signal, the second radio frequency input to receive a second radio frequency input signal, the first radio frequency input signal operating at a different radio frequency band than the second radio frequency input signal;
    a first transistor having a gate coupled to a first local oscillator input and a drain coupled to the common node;
    a second transistor having a gate coupled to a second local oscillator input and a drain coupled to the common node;
    interconnection circuitry coupling the first transistor and the second transistor; and
    a switch to direct one of the first radio frequency input or the second radio frequency input to the common node, wherein
        while the first radio frequency input is directed to the common node, a first local oscillator applies a first local oscillating signal to the gate of the first transistor through the first local oscillator input and the interconnection circuitry turns off the second transistor,
        while the second radio frequency input is directed to the common node, a second local oscillator applies a second local oscillating signal to the gate of the second transistor through the second local oscillator input and the interconnection circuitry turns off the first transistor.

2. The dual band mixer of claim 1, wherein the first transistor has a source coupled to ground and the second transistor has a source coupled to ground.

3. The dual band mixer of claim 1, wherein the first and second transistors are field effect transistors.

4. The dual band mixer of claim 3, wherein the first and second transistors are depletion-type transistors.

5. The dual band mixer of claim 1, further comprising circuitry to turn off the second transistor when a first local oscillator signal is applied to the gate of the first transistor and to turn off the first transistor when a second local oscillator signal is applied to the gate of the second transistor.

6. The dual band mixer of claim 5, wherein the circuitry does not require an external voltage source.

7. The dual band mixer of claim 5, wherein the circuitry includes a first network associated with the first transistor to generate a first negative voltage at a first node when the first local oscillator signal is applied to the gate of the first transistor and a second network associated with the second transistor to generate a second negative voltage at a second node when the second local oscillator signal is applied to the gate of the second transistor.

8. The dual band mixer of claim 7, further comprising a common line coupling the first and second nodes.

9. The dual band mixer of claim 7, wherein the first network includes a first diode connected between the gate of the first transistor and the first node, and a first capacitor and a second diode connected in parallel between the source of the first transistor and the first node.

10. The dual band mixer of claim 9, wherein the second network includes a third diode connected between the gate of the second transistor and the second node, and a second capacitor and a fourth diode connected in parallel between the source of the second transistor and the second node.

11. A method of mixing in a dual band mixer, comprising:

providing a first radio frequency input and a second radio frequency input to a common node, the first radio frequency input to receive a first radio frequency input signal, the second radio frequency input to receive a second radio frequency input signal, the first radio frequency input signal operating at a different radio frequency band than the second radio frequency input signal, the common node being coupled to drains of a first transistor and a second transistor;

directing one of the first radio frequency input or the second radio frequency input to the common node, while the first radio frequency input is directed to the common node, driving a gate of the first transistor with a first local oscillator input and turning off the second transistor;

while the second radio frequency input is directed to the common node, driving a gate of the second transistor with a second local oscillator input and turning off the first transistor; and sensing an intermediate frequency output from the common node.

* * * * *